United States Patent
Lafarre et al.

(10) Patent No.: US 9,737,934 B2
(45) Date of Patent: Aug. 22, 2017

(54) SUBSTRATE HOLDER AND METHOD OF MANUFACTURING A SUBSTRATE HOLDER

(71) Applicant: ASML NETHERLANDS B.V., Veldhoven (NL)

(72) Inventors: Raymond Wilhelmus Louis Lafarre, Helmond (NL); Sjoerd Nicolaas Lambertus Donders, Vught (NL); Nicolaas Ten Kate, Almkerk (NL); Nina Vladimirovna Dziomkina, Eindhoven (NL); Yogesh Pramod Karade, Eindhoven (NL); Elisabeth Corinne Rodenburg, Heeze (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/296,968

(22) Filed: Oct. 18, 2016

(65) Prior Publication Data
US 2017/0036272 A1 Feb. 9, 2017

Related U.S. Application Data

(63) Continuation of application No. 14/373,291, filed as application No. PCT/EP2013/050826 on Jan. 17, 2013, now Pat. No. 9,507,274.
(Continued)

(51) Int. Cl.
*G03B 27/58* (2006.01)
*B22F 7/06* (2006.01)
(Continued)

(52) U.S. Cl.
CPC .............. *B22F 7/062* (2013.01); *B05D 3/06* (2013.01); *B05D 5/00* (2013.01); *B22F 3/1055* (2013.01);
(Continued)

(58) Field of Classification Search
CPC ........ B05D 3/06; B05D 5/00; B23K 26/0081; B23K 26/342; B23K 26/345; B23Q 3/18;
(Continued)

(56) References Cited

U.S. PATENT DOCUMENTS 4,480,284 A 10/1984 Tojo et al.
5,182,170 A 1/1993 Marcus et al.
(Continued)

FOREIGN PATENT DOCUMENTS

CN 1456933 11/2003
CN 1487360 4/2004
(Continued)

OTHER PUBLICATIONS

Robby Ebert et al., "Rapid Microtooling With laser-based procedure," Laserinstitut der Hochschule Mittweida, Rapid Micro, pp. 1-223 (2006-2011).
International Search Report mailed Apr. 24, 2013 in corresponding International Patent Application No. PCT/EP2013/050826.
(Continued)

*Primary Examiner* — Peter B Kim
(74) *Attorney, Agent, or Firm* — Pillsbury Winthrop Shaw Pittman LLP

(57) ABSTRACT

An object holder for a lithographic apparatus has a main body having a surface. A plurality of burls to support an object is formed on the surface or in apertures of a thin-film stack. At least one of the burls is formed by laser-sintering. At least one of the burls formed by laser-sintering may be a repair of a damaged burl previously formed by laser-sintering or another method.

20 Claims, 12 Drawing Sheets

Related U.S. Application Data

(60) Provisional application No. 61/621,660, filed on Apr. 9, 2012, provisional application No. 61/621,648, filed on Apr. 9, 2012, provisional application No. 61/594,857, filed on Feb. 3, 2012.

(51) Int. Cl.

| | | |
|---|---|---|
| *G03F 7/20* | (2006.01) | |
| *B23Q 3/18* | (2006.01) | |
| *B05D 3/06* | (2006.01) | |
| *B05D 5/00* | (2006.01) | |
| *B23K 26/00* | (2014.01) | |
| *B23K 26/342* | (2014.01) | |
| *B33Y 10/00* | (2015.01) | |
| *B33Y 80/00* | (2015.01) | |
| *B22F 3/105* | (2006.01) | |

(52) U.S. Cl.
CPC ........ *B23K 26/0081* (2013.01); *B23K 26/342* (2015.10); *B23Q 3/18* (2013.01); *B33Y 10/00* (2014.12); *B33Y 80/00* (2014.12); *G03F 7/20* (2013.01); *G03F 7/707* (2013.01); *G03F 7/708* (2013.01); *G03F 7/70341* (2013.01); *G03F 7/70416* (2013.01); *G03F 7/70708* (2013.01); *G03F 7/70716* (2013.01); *G03F 7/70733* (2013.01)

(58) Field of Classification Search
CPC .. G03F 7/70416; G03F 7/707; G03F 7/70708; G03F 7/70716; G03F 7/70733; G03F 7/708
USPC ...................................................... 355/72, 75
See application file for complete search history.

(56) References Cited

U.S. PATENT DOCUMENTS

| | | |
|---|---|---|
| 5,368,947 A | 11/1994 | Denney |
| 5,583,736 A | 12/1996 | Anderson et al. |
| 5,663,865 A | 9/1997 | Kawada et al. |
| 5,838,529 A | 11/1998 | Shufflebotham et al. |
| 5,885,654 A | 3/1999 | Hagiwara et al. |
| 6,033,475 A | 3/2000 | Hasebe et al. |
| 6,046,426 A | 4/2000 | Jeantette et al. |
| 6,307,620 B1 | 10/2001 | Takabayashi et al. |
| 6,413,701 B1 | 7/2002 | Van Empel et al. |
| 6,864,957 B2 | 3/2005 | Van Elp et al. |
| 7,050,147 B2 | 5/2006 | Compen |
| 7,078,715 B2 | 7/2006 | Vink et al. |
| 7,092,231 B2 | 8/2006 | Hoeks et al. |
| 7,110,085 B2 | 9/2006 | Zaal et al. |
| 7,119,885 B2 | 10/2006 | Ottens et al. |
| 7,327,439 B2 | 2/2008 | Zaal et al. |
| 7,524,735 B1 | 4/2009 | Gauri et al. |
| 7,816,022 B2 | 10/2010 | Ekstein et al. |
| 7,940,511 B2 | 5/2011 | Sijben |
| 8,228,487 B2 | 7/2012 | Rijpma et al. |
| 8,810,777 B2 | 8/2014 | Cadee et al. |
| 9,442,395 B2 | 9/2016 | Lafarre et al. |
| 2004/0012767 A1 | 1/2004 | Van Elp et al. |
| 2004/0114124 A1 | 6/2004 | Hoeks et al. |
| 2004/0160021 A1 | 8/2004 | Tatsumi et al. |
| 2004/0207824 A1 | 10/2004 | Lof et al. |
| 2004/0247361 A1 | 12/2004 | Zaal et al. |
| 2005/0030512 A1 | 2/2005 | Zaal et al. |
| 2005/0030515 A1 | 2/2005 | Ottens et al. |
| 2005/0041364 A1 | 2/2005 | Kellerman et al. |
| 2005/0045106 A1 | 3/2005 | Boyd et al. |
| 2005/0061995 A1 | 3/2005 | Vink et al. |
| 2005/0095776 A1 | 5/2005 | Usuami |
| 2005/0117141 A1 | 6/2005 | Ottens et al. |
| 2005/0128459 A1 | 6/2005 | Zwet et al. |
| 2005/0146694 A1 | 7/2005 | Tokita |
| 2005/0195382 A1 | 9/2005 | Ottens et al. |
| 2005/0248746 A1 | 11/2005 | Zaal et al. |
| 2006/0006340 A1 | 1/2006 | Compen |
| 2006/0033898 A1 | 2/2006 | Cadee et al. |
| 2006/0038968 A1 | 2/2006 | Kemper et al. |
| 2006/0102277 A1 | 5/2006 | Zaal et al. |
| 2006/0139614 A1 | 6/2006 | Owa et al. |
| 2007/0070319 A1 | 3/2007 | Nakamura et al. |
| 2007/0097346 A1 | 5/2007 | Zaal et al. |
| 2007/0139855 A1 | 6/2007 | Van Mierlo et al. |
| 2007/0217114 A1 | 9/2007 | Sasaki et al. |
| 2007/0285647 A1 | 12/2007 | Kwan et al. |
| 2008/0011737 A1 | 1/2008 | Fukuoka et al. |
| 2008/0024743 A1 | 1/2008 | Kruit et al. |
| 2008/0043210 A1 | 2/2008 | Shubuta |
| 2008/0212046 A1 | 9/2008 | Riepen et al. |
| 2008/0276865 A1 | 11/2008 | Nishimizu et al. |
| 2008/0280536 A1 | 11/2008 | Sasaki et al. |
| 2009/0079525 A1 | 3/2009 | Sijben |
| 2009/0207392 A1 | 8/2009 | Rijpma et al. |
| 2009/0262318 A1 | 10/2009 | Van Den Dungen et al. |
| 2009/0279060 A1 | 11/2009 | Direcks et al. |
| 2009/0279062 A1 | 11/2009 | Direcks et al. |
| 2009/0284894 A1 | 11/2009 | Cooke |
| 2010/0193501 A1 | 8/2010 | Zucker et al. |
| 2010/0200901 A1 | 8/2010 | Kim |
| 2010/0214549 A1 | 8/2010 | Cadee et al. |
| 2011/0036990 A1 | 2/2011 | Stone et al. |
| 2011/0222032 A1 | 9/2011 | Ten Kate et al. |
| 2011/0222033 A1 | 9/2011 | Ten Kate et al. |
| 2011/0292561 A1 | 12/2011 | Kamimura et al. |
| 2012/0013865 A1 | 1/2012 | Laurent et al. |
| 2012/0044609 A1 | 2/2012 | Cooke et al. |
| 2012/0147353 A1 | 6/2012 | Lafarre et al. |
| 2012/0177942 A1 | 7/2012 | Chang et al. |
| 2012/0212725 A1 | 8/2012 | Lafarre et al. |
| 2012/0242271 A1 | 9/2012 | Van Der Toorn et al. |
| 2012/0274920 A1 | 11/2012 | Bex et al. |
| 2013/0094009 A1 | 4/2013 | Lafarre et al. |
| 2013/0164688 A1 | 6/2013 | Cadee et al. |
| 2013/0189802 A1 | 7/2013 | Tromp et al. |
| 2014/0368804 A1 | 12/2014 | Lafarre et al. |

FOREIGN PATENT DOCUMENTS

| | | | |
|---|---|---|---|
| CN | 1580956 | 2/2005 | |
| CN | 101599453 | 12/2009 | |
| CN | 101803001 | 8/2010 | |
| CN | 102193331 | 9/2011 | |
| EP | 1 510 868 | 3/2005 | |
| EP | 2 365 390 | 9/2011 | |
| JP | H03-187240 | 8/1991 | |
| JP | H04-103750 | 4/1992 | |
| JP | 5-047909 | 2/1993 | |
| JP | H05-205997 | 8/1993 | |
| JP | H07-19831 | 3/1995 | |
| JP | H09-148379 | 6/1997 | |
| JP | H09-199574 | 7/1997 | |
| JP | 09-270327 | 10/1997 | |
| JP | 09-270445 | 10/1997 | |
| JP | 09283605 A * | 10/1997 | ............ G03F 7/707 |
| JP | 2000-174105 | 6/2000 | |
| JP | 2000-202626 | 7/2000 | |
| JP | 2000-311933 | 11/2000 | |
| JP | 2001-028333 | 1/2001 | |
| JP | 2001-237303 | 8/2001 | |
| JP | 2003-518193 | 6/2003 | |
| JP | 2004-531067 | 10/2004 | |
| JP | 2005-029401 | 2/2005 | |
| JP | 2005-079586 | 3/2005 | |
| JP | 2005-328045 | 11/2005 | |
| JP | 2006-024954 | 1/2006 | |
| JP | 2006-148101 | 6/2006 | |
| JP | 2007-503123 | 2/2007 | |
| JP | 2007-158309 | 6/2007 | |
| JP | 2007-201068 | 8/2007 | |
| JP | 2008-028052 | 2/2008 | |
| JP | 2008-135736 | 6/2008 | |

(56) References Cited

FOREIGN PATENT DOCUMENTS

| | | |
|---|---|---|
| JP | 2008-160093 | 7/2008 |
| JP | 2008-189956 | 8/2008 |
| JP | 2009-179507 | 8/2009 |
| JP | 2009-200486 | 9/2009 |
| JP | 2009-246302 A | 10/2009 |
| JP | 4-378053 | 12/2009 |
| JP | 2010-161319 | 7/2010 |
| JP | 2010-165776 | 7/2010 |
| JP | 2010-199581 | 9/2010 |
| JP | 2011-081040 | 4/2011 |
| JP | 2011-521470 | 7/2011 |
| JP | 2011-167768 | 9/2011 |
| JP | 2011-176275 | 9/2011 |
| JP | 2011-192992 | 9/2011 |
| JP | 2011-199303 | 10/2011 |
| JP | 2012-129524 | 7/2012 |
| JP | 2012-235095 | 11/2012 |
| KR | 2009-0008658 | 1/2009 |
| WO | 99/49504 | 9/1999 |
| WO | 00/00921 | 1/2000 |
| WO | 01/45882 | 6/2001 |
| WO | 2008/047886 | 4/2008 |
| WO | 2008/057483 | 5/2008 |
| WO | 2010/095540 | 8/2010 |
| WO | 2011/053145 | 5/2011 |
| WO | 2012/005294 | 1/2012 |
| WO | 2013/113568 | 8/2013 |
| WO | 2013/156236 | 10/2013 |

OTHER PUBLICATIONS

A. Streek et al., "Laser micro sintering—a quality leap through improvement of powder packing," Laserapplikationszentrum, Fachbereich MPI, Hochschule Mittweida, 12 pages (2008).

S. Kloetzer et al., "Micro-Cladding Using a Pulsed Fibre Laser and Scanner," Proceedings of LPM2010—the 11$^{th}$ International Symposium on Laser Precision Microfabrication, pp. 1-5 (Jun. 2010).

H. Exner et al., "Lasermikrosintern von keramischen Materialien" Laserinstitut Mittelsachsen e.V./Hochschule Mittweida, RTejournal, vol. 3, pp. 1-18, Aug. 3, 2006.

International Preliminary Report on Patentability mailed Aug. 14, 2014 in corresponding International Patent Application No. PCT/EP2013/050826.

Japanese Office Action mailed Aug. 28, 2015 in corresponding Japanese Patent Application No. 2014-555139.

Japanese Office Action mailed Sep. 2, 2015 in corresponding Japanese Patent Application No. 2014-555140.

U.S. Office Action dated Nov. 25, 2015 in corresponding U.S. Appl. No. 14/374,197.

U.S. Office Action dated Feb. 22, 2016 in corresponding U.S. Appl. No. 14/374,197.

Japanese Office Action dated May 17, 2016 in corresponding Japanese Patent Application No. 2014-555139.

Non-Final Office Action issued in corresponding U.S. Appl. No. 15/261,553, dated Mar. 14, 2017.

English Translation of Notice of Reasons for Rejection issued in corresponding Japanese Patent Application No. 2016-121468, dated May 1, 2017.

* cited by examiner

US 9,737,934 B2

SUBSTRATE HOLDER AND METHOD OF MANUFACTURING A SUBSTRATE HOLDER

CROSS-REFERENCE TO RELATED APPLICATIONS

This application is a continuation of U.S. patent application Ser. No. 14/373,291, filed Jul. 18, 2014, now allowed, which is the U.S. national phase entry of PCT patent application no. PCT/EP2013/050826, which was filed on Jan. 17, 2013, which claims the benefit of priority of U.S. provisional application No. 61/594,857, which was filed on Feb. 3, 2012, U.S. provisional application No. 61/621,648, which was filed on Apr. 9, 2012 and U.S. provisional application No. 61/621,660, which was filed on Apr. 9, 2012, each of which are incorporated herein in its entirety by reference.

FIELD

The present invention relates to a substrate holder, a lithographic apparatus, a device manufacturing method, and a method of manufacturing a substrate holder.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

SUMMARY

In a conventional lithography apparatus, the substrate to be exposed may be supported by a substrate holder which in turn is supported by a substrate table. The substrate holder is often a flat rigid disc corresponding in size and shape to the substrate (although it may have a different size or shape). It has an array of projections, referred to as burls or pimples, projecting from at least one side. In an embodiment, the substrate holder has an array of projections on two opposite sides. In this case, when the substrate holder is placed on the substrate table, the main body of the substrate holder is held a small distance above the substrate table while the ends of the burls on one side of the substrate holder lie on the surface of the substrate table. Similarly, when the substrate rests on the top of the burls on the opposite side of the substrate holder, the substrate is spaced apart from the main body of the substrate holder. One purpose of this is to help prevent a particle (i.e. a contaminating particle such as a dust particle) which might be present on either the substrate table or substrate holder from distorting the substrate holder or the substrate. Since the total surface area of the burls is only a small fraction of the total area of the substrate or substrate holder, it is highly probable that any particle will lie between burls and its presence will have no effect.

Due to the high accelerations experienced by the substrate in use of a high-throughput lithographic apparatus, it is not sufficient to allow the substrate simply to rest on the burls of the substrate holder. It is clamped in place. Two methods of clamping the substrate in place are known—vacuum clamping and electrostatic clamping. In vacuum clamping, the space between the substrate holder and substrate and optionally between the substrate table and substrate holder are partially evacuated so that the substrate is held in place by the higher pressure of gas or liquid above it. Vacuum clamping however may not be feasible where the beam path and/or the environment near the substrate or substrate holder is kept at a low or very low pressure, e.g. for extreme ultraviolet (EUV) radiation lithography. In this case, it may not be possible to develop a sufficiently large pressure difference across the substrate (or substrate holder) to clamp it. Electrostatic clamping can therefore be used in such a circumstance (or in other circumstances). In electrostatic clamping, an electrode provided on the substrate table and/or substrate holder is raised to a high potential, e.g. 10 to 5000 V, and electrostatic forces attract the substrate. Thus another purpose of the burls is to space the substrate, substrate holder and substrate table apart in order to enable electrostatic clamping.

Burls can be used in various other places within a lithographic apparatus, for example in a support for a patterning device such as a mask, in a gripper of substrate or patterning device handling apparatus, and/or a reticle clamp. Burls in different places may have different requirements as to one or more of their dimensions and other physical properties. A different method of manufacture may apply. In many cases, damage to one or more burls may necessitate replacement of an entire component.

It is desirable, for example, to provide an object holder for use in a lithographic apparatus, the holder having burls, e.g.

of different shapes, sizes and/or compositions, and a method of manufacturing an object holder having such burls.

According to an aspect of the invention, there is provided a method of manufacturing an object holder for use in a lithographic apparatus, the method comprising: providing a main body having a surface; and forming a plurality of burls on the surface, the burls projecting from the surface and having end surfaces to support an object, wherein forming at least part of at least one of the burls comprises laser-sintering.

According to an aspect of the invention, there is provided an object holder for use in a lithographic apparatus, the object holder comprising: a main body having a surface; and a plurality of burls provided on the surface and having end surfaces to support an object, wherein at least part of at least one of the burls has been formed by laser-sintering.

According to an aspect of the invention, there is provided a lithographic apparatus, comprising: a support structure configured to support a patterning device; a projection system arranged to project a beam patterned by the patterning device onto a substrate; and a substrate holder arranged to hold the substrate, the substrate holder being as described herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
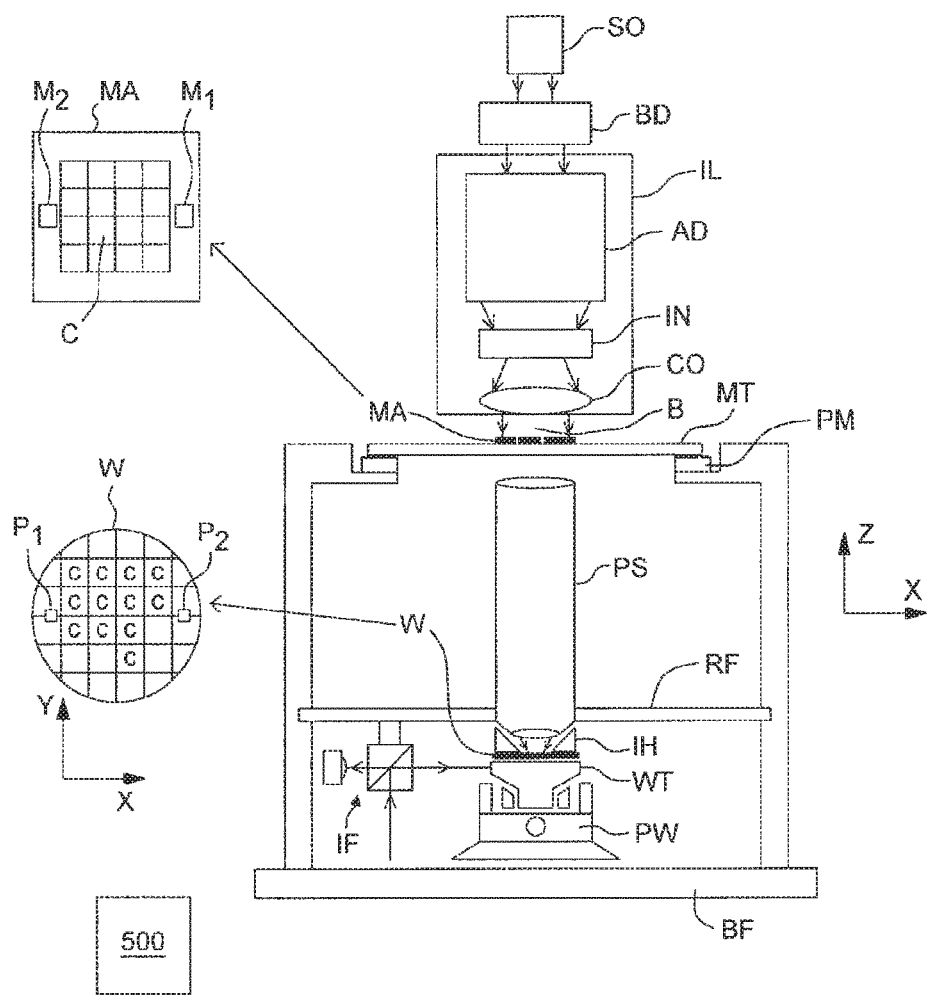
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation, DUV radiation or EUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device".

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The terms "projection system" used herein should be broadly interpreted as encompassing any type of system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two or more substrate support structures, such as substrate stages or substrate tables, and/or two or more support structures for patterning devices. In an apparatus with multiple substrate stages, all the substrate stages can be equivalent and interchangeable. In an embodiment, at least one of the multiple substrate stages is particularly adapted for exposure steps and at least one of the multiple substrate stages is particularly adapted for measurement or preparatory steps. In an embodiment of the invention one or more of the multiple substrate stages is replaced by a measurement stage. A measurement stage includes at least part one or more sensor systems such as a sensor detector and/or target of the sensor system but does not support a substrate. The measurement stage is positionable in the projection beam in place of a substrate stage or a support structure for a patterning device. In such apparatus the additional stages may be used in parallel, or preparatory steps may be carried out on one or more stages while one or more other stages are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AM configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. Substrate W is held on the substrate table WT by a substrate holder according to an embodiment of the present invention and described further below. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In many lithographic apparatuses, a fluid, in particular a liquid, is provided between the final element of the projection system using a liquid supply system IH to enable imaging of smaller features and/or increase the effective NA of the apparatus. An embodiment of the invention is described further below with reference to such an immersion apparatus, but may equally be embodied in a non-immersion apparatus. Arrangements to provide liquid between a final element of the projection system and the substrate can be classed into at least two general categories. These are the bath type arrangement and the so called localized immersion system. In the bath type arrangement substantially the whole of the substrate and optionally part of the substrate table is submersed in a bath of liquid. The localized immersion system uses a liquid supply system in which liquid is only provided to a localized area of the substrate. In the latter category, the space filled by liquid is smaller in plan than the top surface of the substrate and the area filled with liquid remains substantially stationary relative to the projection system while the substrate moves underneath that area. Another arrangement, to which an embodiment of the invention is directed, is the all wet solution in which the liquid is unconfined. In this arrangement substantially the whole top surface of the substrate and all or part of the substrate table is covered in immersion liquid. The depth of the liquid covering at least the substrate is small. The liquid may be a film, such as a thin-film, of liquid on the substrate.

Four different types of localized liquid supply systems are illustrated in FIGS. 2 to 5. Any of the liquid supply devices of FIGS. 2 to 5 may be used in an unconfined system; however, sealing features are not present, are not activated, are not as efficient as normal or are otherwise ineffective to seal liquid to only the localized area.

Figure 2:
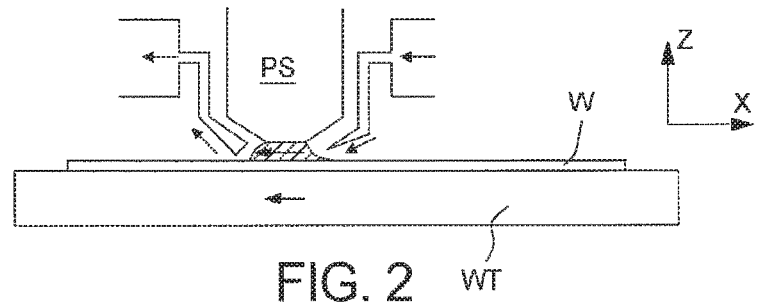
FIGS. 2 and 3 depict a liquid supply system for use in a lithographic projection apparatus.
Figure 3:
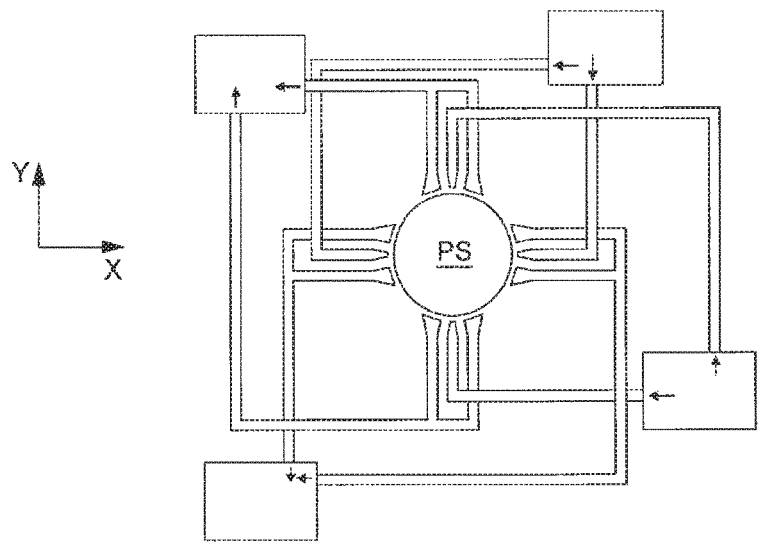

One of the arrangements proposed for a localized immersion system is for a liquid supply system to provide liquid to only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet onto the substrate, desirably along the direction of movement of the substrate relative to the final element, and is removed by at least one outlet after having passed under the projection system. That is, as the substrate is scanned beneath the element in a −X direction, liquid is supplied at the +X side of the element and taken up at the −X side.

FIG. 2 shows the arrangement schematically in which liquid is supplied via inlet and is taken up on the other side of the element by outlet which is connected to a low pressure source. The arrows above the substrate W illustrate the direction of liquid flow, and the arrow below the substrate W illustrates the direction of movement of the substrate table. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element. Arrows in liquid supply and liquid recovery devices indicate the direction of liquid flow.

Figure 4:
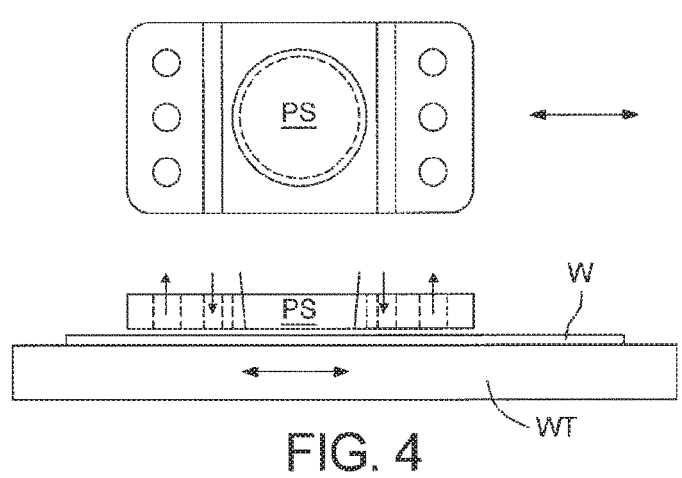
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets and outlets can be arranged in a plate with a hole in its center and through which the projection beam is projected. Liquid is supplied by one groove inlet on one side of the projection system PS and removed by a plurality of discrete outlets on the other side of the projection system PS, causing a flow of a thin-film of liquid between the projection system PS and the substrate W. The choice of which combination of inlet and outlets to use can depend on the direction of movement of the substrate W (the other combination of inlet and outlets being inactive). In the cross-sectional view of FIG. 4, arrows illustrate the direction of liquid flow in to inlets and out of outlets.

Figure 5:
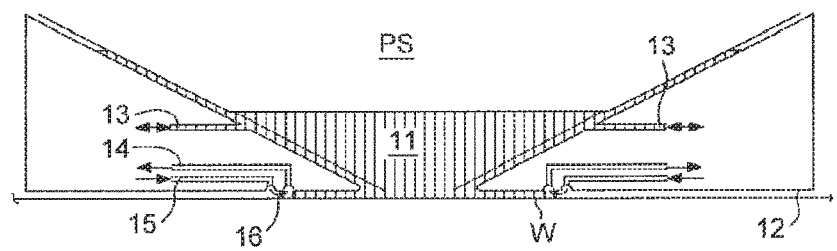
FIG. 5 depicts, in cross-section, a barrier member which may be used in an embodiment of the present invention as an immersion liquid supply system.

Another arrangement which has been proposed is to provide the liquid supply system with a liquid confinement member which extends along at least a part of a boundary of the space between the final element of the projection system and the substrate table. Such an arrangement is illustrated in FIG. 5. The liquid confinement member is substantially stationary relative to the projection system in the XY plane, though there may be some relative movement in the Z direction (in the direction of the optical axis). A seal is formed between the liquid confinement member and the surface of the substrate. In an embodiment, a seal is formed between the liquid confinement member and the surface of the substrate and may be a contactless seal such as a gas seal. Such a system is disclosed in United States patent application publication no. US 2004-0207824.

The fluid handling structure 12 includes a liquid confinement member and at least partly contains liquid in the space 11 between a final element of the projection system PS and the substrate W. A contactless seal 16 to the substrate W may be formed around the image field of the projection system so that liquid is confined within the space between the substrate W surface and the final element of the projection system PS. The space is at least partly formed by the fluid handling structure 12 positioned below and surrounding the final element of the projection system PS. Liquid is brought into the space below the projection system and within the fluid handling structure 12 by liquid inlet 13. The liquid may be removed by liquid outlet 13. The fluid handling structure 12 may extend a little above the final element of the projection system. The liquid level rises above the final element so that a buffer of liquid is provided. In an embodiment, the fluid handling structure 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

In an embodiment, the liquid is contained in the space 11 by a gas seal 16 which, during use, is formed between the bottom of the fluid handling structure 12 and the surface of the substrate W. The gas seal is formed by gas, e.g. air, synthetic air, $N_2$ or another inert gas. The gas in the gas seal is provided under pressure via inlet 15 to the gap between fluid handling structure 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the fluid handling structure 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824.

The example of FIG. 5 is a localized area arrangement in which liquid is only provided to a localized area of the top surface of the substrate W at any one time. Other arrangements are possible, including fluid handling systems which make use of a single phase extractor or a two phase extractor as disclosed, for example, in United States patent application publication no US 2006-0038968.

Another arrangement which is possible is one which works on a gas drag principle. The so-called gas drag principle has been described, for example, in United States patent application publication nos. US 2008-0212046, US 2009-0279060, and US 2009-0279062. In that system the extraction holes are arranged in a shape which desirably has a corner. The corner may be aligned with the stepping or scanning directions. This reduces the force on the meniscus between two openings in the surface of the fluid handing structure for a given speed in the step or scan direction compared to a fluid handling structure having two outlets aligned perpendicular to the direction of scan.

Also disclosed in US 2008-0212046 is a gas knife positioned radially outside the main liquid retrieval feature. The gas knife traps any liquid which gets past the main liquid retrieval feature. Such a gas knife may be present in a so called gas drag principle arrangement (as disclosed in US 2008-0212046), in a single or two phase extractor arrangement (such as disclosed in United States patent application publication no. US 2009-0262318) or any other arrangement.

Many other types of liquid supply system are possible. The present invention is neither limited to any particular type of liquid supply system, nor to immersion lithography. The invention may be applied equally in any lithography. In an EUV lithography apparatus, the beam path is substantially evacuated and immersion arrangements described above are not used.

A control system 500 shown in FIG. 1 controls the overall operations of the lithographic apparatus and in particular performs an optimization process described further below. Control system 500 can be embodied as a suitably-programmed general purpose computer comprising a central processing unit and volatile and non-volatile storage. Optionally, the control system may further comprise one or more input and output devices such as a keyboard and screen, one or more network connections and/or one or more interfaces to the various parts of the lithographic apparatus. It will be appreciated that a one-to-one relationship between controlling computer and lithographic apparatus is not necessary. In an embodiment of the invention one computer can control multiple lithographic apparatuses. In an embodiment of the invention, multiple networked computers can be used to control one lithographic apparatus. The control system 500 may also be configured to control one or more associated process devices and substrate handling devices in a lithocell or cluster of which the lithographic apparatus forms a part. The control system 500 can also be configured to be subordinate to a supervisory control system of a lithocell or cluster and/or an overall control system of a fab.

Figure 6:
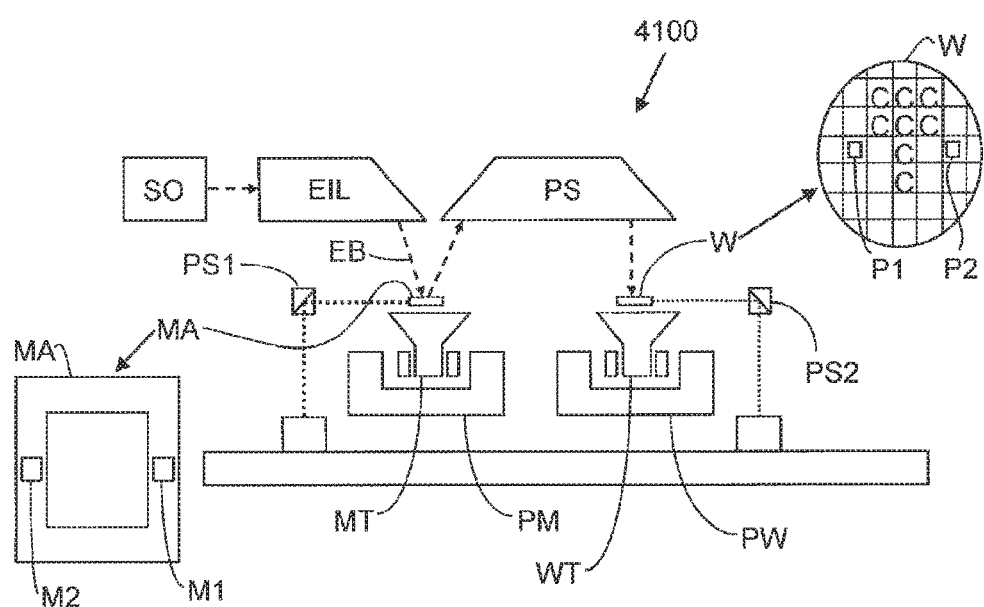
FIG. 6 depicts a lithographic apparatus according to an embodiment of the invention.

FIG. 6 schematically depicts an EUV lithographic apparatus 4100 including a source collector apparatus SO. The apparatus comprises:

an illumination system (illuminator) EIL configured to condition a radiation beam B (e.g. EUV radiation);

a support structure (e.g. a mask table) MT constructed to support a patterning device (e.g. a mask or a reticle) MA and connected to a first positioner PM configured to accurately position the patterning device;

a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

These basic components of the EUV lithographic apparatus are similar in function to the corresponding components of the lithographic apparatus of FIG. 1. The description below mainly covers areas of difference and duplicative description of aspects of the components that are the same is omitted.

In an EUV lithographic apparatus, it is desirable to use a vacuum or low pressure environment since gases can absorb too much radiation. A vacuum environment can therefore be provided to the whole beam path with the aid of a vacuum wall and one or more vacuum pumps.

Referring to FIG. 6, the EUV illuminator EIL receives an extreme ultra violet radiation beam from the source collector apparatus SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the desired line-emitting element, with a laser beam. The source collector apparatus SO may be part of an EUV radiation system including a laser, not shown in FIG. 6, to provide the laser beam exciting the fuel. The resulting plasma emits output radiation, e.g., EUV radiation, which is collected using a radiation collector, disposed in the source collector apparatus. The laser and the source collector apparatus may be separate entities, for example when a $CO_2$ laser is used to provide the laser beam for fuel excitation.

In such cases, the laser is not considered to form part of the lithographic apparatus and the radiation beam is passed from the laser to the source collector apparatus with the aid of a beam delivery system comprising, for example, suitable directing mirrors and/or a beam expander. In other cases the source may be an integral part of the source collector apparatus, for example when the source is a discharge-produced plasma EUV generator, often termed as a DPP source.

The EUV illuminator EIL may comprise an adjuster to adjust the angular intensity distribution of the radiation beam EB. Generally, at least the outer and/or inner radial extent (commonly referred to as σ-outer and σ-inner, respectively) of the intensity distribution in a pupil plane of the illuminator can be adjusted. In addition, the EUV illuminator EIL may comprise various other components, such as facetted field and pupil mirror devices. The EUV illuminator EIL may be used to condition the radiation beam EB, to have a desired uniformity and intensity distribution in its cross section.

The radiation beam EB is incident on the patterning device (e.g., mask) MA, which is held on the support structure (e.g., mask table) MT, and is patterned by the patterning device. After being reflected from the patterning device (e.g. mask) MA, the radiation beam EB passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam EB. Similarly, the first positioner PM and another position sensor PS1 can be used to accurately position the patterning device (e.g. mask) MA with respect to the path of the radiation beam EB. Patterning device (e.g. mask) MA and substrate W may be aligned using mask alignment marks M1, M2 and substrate alignment marks P1, P2.

The depicted apparatus could be used the same modes as the apparatus of FIG. 1.

Figure 7:
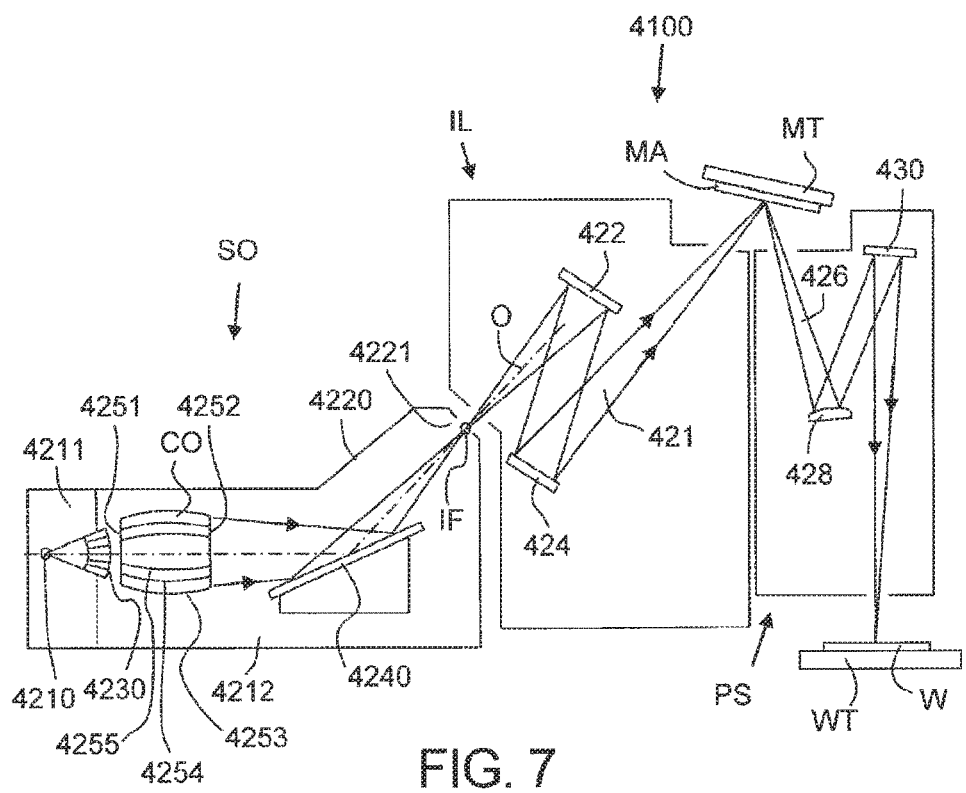
FIG. 7 is a more detailed view of the apparatus 4100.

FIG. 7 shows the EUV apparatus 4100 in more detail, including the source collector apparatus SO, the EUV illumination system EIL, and the projection system PS. The source collector apparatus SO is constructed and arranged such that a vacuum environment can be maintained in an enclosing structure 4220 of the source collector apparatus SO. An EUV radiation emitting plasma 4210 may be formed by a discharge produced plasma source. EUV radiation may be produced by a gas or vapor, for example Xe gas, Li vapor or Sn vapor in which the plasma 4210 is created to emit radiation in the EUV range of the electromagnetic spectrum. The plasma 4210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the plasma 4210 is passed from a source chamber 4211 into a collector chamber 4212 via an optional gas barrier and/or contaminant trap 4230 (in some cases also referred to as contaminant barrier or foil trap) which is positioned in or behind an opening in source chamber 4211. The contaminant trap 4230 may include a channel structure. Contamination trap 4230 may also include a gas barrier or a combination of a gas barrier and a channel structure. The contaminant trap or contaminant barrier 4230 further indicated herein at least includes a channel structure, as known in the art.

The collector chamber 4212 may include a radiation collector CO which may be a so-called grazing incidence collector. Radiation collector CO has an upstream radiation collector side 4251 and a downstream radiation collector side 4252. Radiation that traverses collector CO can be reflected by a grating spectral filter 4240 to be focused in a virtual source point IF. The virtual source point IF is commonly referred to as the intermediate focus, and the source collector apparatus is arranged such that the intermediate focus IF is located at or near an opening 4221 in the enclosing structure 4220. The virtual source point IF is an image of the radiation emitting plasma 4210.

Subsequently the radiation traverses the illumination system IL, which may include a facetted field mirror device 422 and a facetted pupil mirror device 424 arranged to provide a desired angular distribution of the radiation beam 421, at the patterning device MA, as well as a desired uniformity of radiation intensity at the patterning device MA. Upon reflection of the beam of radiation 421 at the patterning device MA, held by the support structure MT, a patterned beam 426 is formed and the patterned beam 426 is imaged by the projection system PS via reflective elements 428, 430 onto a substrate W held by the substrate stage or substrate table WT.

More elements than shown may generally be present in illumination optics unit IL and projection system PS. The grating spectral filter 4240 may optionally be present, depending upon the type of lithographic apparatus. There may be more mirrors present than those shown in the Figures, for example there may be from 1 to 6 additional reflective elements present in the projection system PS than shown in FIG. 7.

Collector optic CO, as illustrated in FIG. 7, is depicted as a nested collector with grazing incidence reflectors 4253, 4254 and 4255, just as an example of a collector (or collector mirror). The grazing incidence reflectors 4253, 4254 and 4255 are disposed axially symmetric around an optical axis O and a collector optic CO of this type is preferably used in combination with a discharge produced plasma source, often called a DPP source.

Figure 8:
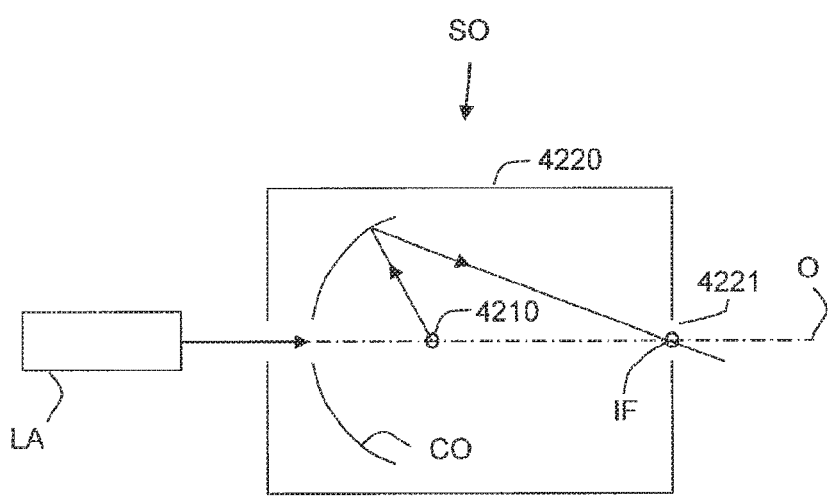
FIG. 8 is a more detailed view of the source collector apparatus SO of the apparatus of FIGS. 6 and 7.

Alternatively, the source collector apparatus SO may be part of an LPP radiation system as shown in FIG. 8. A laser LA is arranged to deposit laser energy into a fuel, such as xenon (Xe), tin (Sn) or lithium (Li), creating the highly ionized plasma 4210 with electron temperatures of several 10's of eV. The energetic radiation generated during de-excitation and recombination of these ions is emitted from the plasma, collected by a near normal incidence collector optic CO and focused onto the opening 4221 in the enclosing structure 4220.

Figure 9:
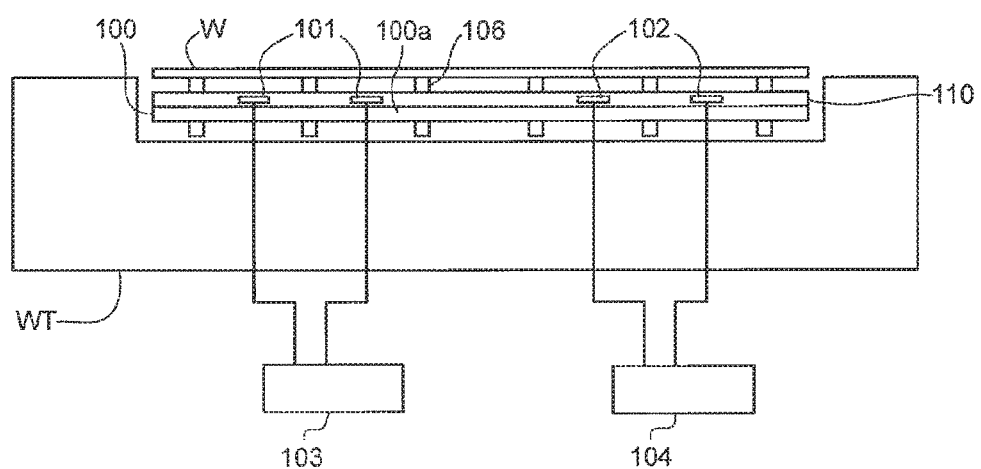
FIG. 9 depicts in cross-section a substrate table and a substrate holder according to an embodiment of the invention.

FIG. 9 depicts a substrate holder according to an embodiment of the invention. It may be held within a recess in substrate table WT and supports substrate W. The main body of the substrate holder 100 has the form of a flat plate, for example a disc substantially corresponding in shape and size to the substrate W. The substrate holder can, for example, be formed from Si, SiC, SiSiC, aluminum nitride (AlN), ZERODUR™ ceramic, cordierite, or some other suitable ceramic or glass-ceramic material. At least on a top side, in an embodiment on both sides, the substrate holder has projections 106, commonly referred to as burls. In an embodiment, the substrate holder is an integral part of the substrate table and does not have burls on the lower surface. The burls are not shown to scale in FIG. 9. Some or all of the burls are formed by laser sintering as described below.

In a practical embodiment, there can be many hundreds or thousands of burls, e.g. more than 10,000 or more than 40,000, distributed across a substrate holder, e.g., of width (e.g., diameter) 200 mm, 300 mm or 450 mm. The tips of the burls have a small area, e.g. less than 1 mm². Thus the total area of all of the burls on one side of the substrate holder 100 is less than about 10%, e.g. from 1 to 3%, of the total surface area of the substrate holder. Because of the burl arrangement, there is a high probability that any particle that might lie on the surface of the substrate, substrate holder or substrate table will fall between burls and will not therefore result in a deformation of the substrate or substrate holder.

The burl arrangement may form a pattern and/or may have a periodic arrangement. The burl arrangement can be regular or can vary as desired to provide appropriate distribution of force on the substrate W and substrate table WT. The burls can have any shape in plan but are commonly circular in plan. The burls can have the same shape and dimensions throughout their height but are commonly tapered. The distance that the burls project from the rest of the surface of the main body 100a of the substrate holder 100 is in the range of from about 1 μm to about 5 mm, desirably from about 5 μm to about 250 μm. The thickness of the main body 100a of the substrate holder 100 can be in the range of about 1 mm to about 50 mm, desirably in the range of about 5 mm to 20 mm, typically 10 mm.

Beneficially, the burls may be formed with very consistent dimensions. Desirably the variation between heights of different burls is very small. Short burls can be formed (e.g. shorter than 20 μm, shorter than 15 μm, shorter than 5 μm or shorter than 3 μm). Shorter burls are beneficial because they increase the heat transfer between the substrate and the substrate holder. The gap between the top of the substrate holder away from the burls and the supported surface of a substrate on the substrate holder is smaller than a support with a greater height. Such a small gap facilitates the transfer of heat from a temperature conditioning element (e.g., heater) to the supported substrate. The minimum burl height is determined by the variations in the total height of the thin-film stack and the amount of unflatness of the substrate and substrate holder. In an embodiment the burl height is greater than or equal to 1 μm or 2 μm.

The burls can have a width (e.g., diameter) less than or equal to 0.5 mm. In an embodiment the burls have a width (e.g., diameter) in the range of from about 200 μm to about 500 μm. The spacing between burls is between about 1.5 mm to about 3 mm.

Further, an embodiment of the invention allows use of a wider range of materials for the substrate holder. Materials that are not suitable for previous methods of forming burls or substrate holders can be used in an embodiment of the invention. In an embodiment, it is possible to use material such as cordierite, a low CTE glass-ceramic, which cannot easily be machined to form burls. Cordierite has good properties for use in a substrate holder. For example, cordierite has a high Young's modulus of about 140 Gpa and a low thermal conductivity of about 4 W/mK.

A substrate holder manufactured according to an embodiment of the invention can have a long usable life time due to robust manufacturing methods. An embodiment of the invention can exhibit desirable wear properties, for example good wear resistance and therefore low generation of particular contaminants. Beneficially, an embodiment of the invention can avoid the need for coating the substrate holder.

A substrate holder according to an embodiment of the invention can have a thin-film component 110 formed on one or both surfaces. A thin-film component may have a layer thickness in the range of from about 2 nm to about 100 μm. Such a thin film component may have one or a plurality of layers. Each layer may be formed by a process including chemical vapor deposition, physical vapor deposition (e.g. sputtering), dip coating, spin coating and/or spray coating. In an embodiment, a component formed on the substrate holder comprises a thin-film stack, i.e. including a plurality of thin-film layers. Such components are described further below. Although reference in this description is to a thin film stack formed on the top surface of a substrate holder, the thin film stack may be formed on the undersurface of the substrate holder, or on a substrate table beneath a substrate holder, or on any other surface of the substrate table or substrate holder, including a surface of an integral substrate holder and substrate table.

An electronic or electric component to be formed on the substrate table can include, for example, an electrode, a resistive heater and/or a sensor, such as (in a non-limiting list) a strain sensor, a magnetic sensor, a pressure sensor, a capacitive sensor or a temperature sensor. A heater and sensor can be used to control and/or monitor locally the temperature of the substrate holder and/or substrate. Such local control and/or monitoring can reduce undesired, or induce desired, temperature variation and stress in the substrate holder or substrate. Desirably, the heater and sensor are formed on, around and/or over the same region as each other. It is desirable to control temperature and/or stress of the substrate in order to reduce or eliminate imaging errors such as overlay errors due to local expansion or contraction of the substrate. For example, in an immersion lithography apparatus, evaporation of residual immersion liquid (e.g., water) on the substrate can cause localized cooling, may apply a heat load to the surface on which the liquid is located, and hence shrinkage of the substrate. Conversely, the energy delivered to the substrate by the projection beam during exposure can cause significant heating and therefore expansion of the substrate.

In an embodiment, the component to be formed is an electrode for an electrostatic clamp. In electrostatic clamping, an electrode provided on the substrate table and/or substrate holder is raised to a high potential, e.g. from 10 to 5,000 V. The substrate can be grounded or floating. Electrostatic forces in the electric field generated by the electrode attract the substrate to the substrate table and/or holder to provide a clamping force. This is described further below.

One or more electrical connections can be provided to connect the electric or electronic component on the substrate holder to a voltage source (not shown for convenience). If the component is an electrostatic clamp, the electrode on the substrate has an electrical connection to the voltage source. The component may be on a top surface of the substrate support. At least part of the electrical connection may pass through the body of the substrate support as described in U.S. patent application no. 61/555,359, filed on 3 Nov. 2011, which is hereby incorporated by reference in its entirety.

In an embodiment, one or more localized heaters 101 are controlled by controller 103 to provide a desired amount of heat to the substrate holder 100 and substrate W to control the temperature of the substrate W. One or more temperature sensors 102 are connected to controller 104 which monitors the temperature of the substrate holder 100 and/or substrate W. Arrangements using one or more heaters and temperature sensors to locally control the temperature of a substrate are described in copending U.S. patent application publication no. US 2012-0013865, which document is incorporated herein by reference in its entirety. The arrangements described therein can be modified to make use of a resistive heater and temperature sensor as described herein. Further details of thin-film stacks including components thereof and a method of manufacture thereof are given in U.S. patent application Ser. No. 13/403,706 filed on 23 Feb. 2012 and U.S. patent application No. 61/621,648, filed on Apr. 9, 2012, which documents are hereby incorporated by reference in their entireties.

A substrate holder for use in a conventional (e.g., DUV) lithographic apparatus (e.g. an immersion lithographic apparatus) is desirably provided with one or more thin-film temperature sensors and/or one or more thin-film heaters. Other forms of sensor and/or heater can be provided in, on and/or under the substrate holder.

A substrate holder for use in an EUV lithographic apparatus is desirably provided with a thin-film electrostatic clamp and optionally one or more thin-film temperature sensors and/or one or more thin-film heaters. Other forms of sensor and/or heater can be provided in, on and/or under the substrate holder.

As mentioned, laser sintering may be used to form the burls. This method is illustrated in FIGS. 10A to E and starts with a flat plate of the desired shape which forms the main body 400 of the substrate holder. The flat plate may be pre-formed by another technique. In an embodiment the plate is formed of SiSiC but one or more other materials such as Invar™ alloy, ZERODUR ceramic, ULE™ glass, fused silica, cordierite, boron nitride, silicon nitride, aluminum nitride (AlN) and/or SiC can be used. Desirably, a surface 400a of the plate is ground and/or polished to a desired degree of flatness. In an embodiment, the surface is cleaned, e.g. with ozone, but this step can be omitted. In an embodiment, the surface 400a is treated to promote adherence of one or more subsequent layers, e.g. by application of a primer layer, but this step can be omitted. On the plate, an isolation layer 410 is applied to isolate one or more metal layers to be formed above it from the main body of the substrate holder. In an embodiment, the isolation layer 410 improves flatness. The isolation layer 410 may be made of BCB applied by spin or spray coating as described above or of $SiO_2$ applied by a PECVD process, or other suitable material. On top of the isolation layer, a metal layer 440 is applied, e.g. by PVD, to arrive at the situation shown in FIG. 10A.

Figure 10A:
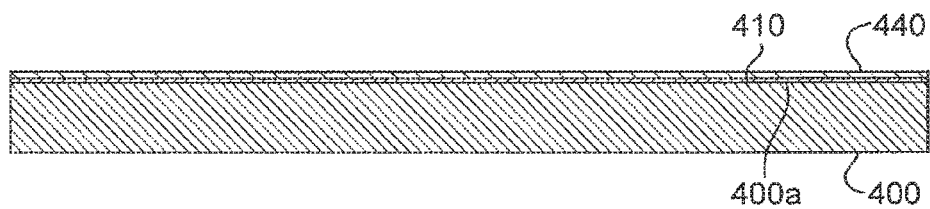
FIGS. 10A to 10E depict steps in a method of manufacturing a substrate holder according to an embodiment of the invention.
Figure 10B:
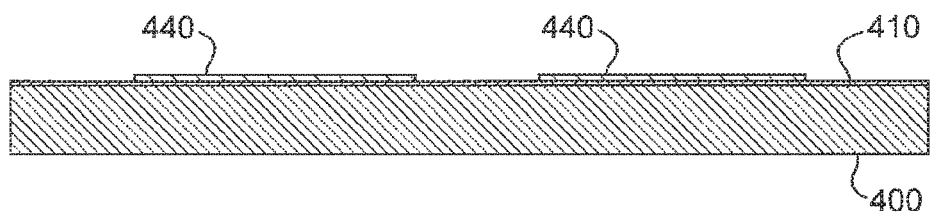

The metal layer is then patterned, e.g. by lithography and selective etching, e.g. a wet etch, to define the desired pattern to form a desired component, e.g. an electrode, a sensor or a heater. This step also removes the metal layer in an area where burls are to be formed in a subsequent step. At this stage, the substrate holder is as illustrated in FIG. 10B.

Figure 10C:
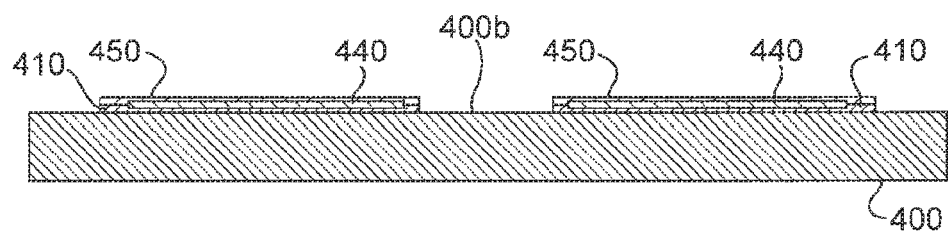

Over the patterned metal layer, an isolation or dielectric layer 450 is applied and an opening through to the main body or a base layer, i.e. through both isolation layers, are formed in locations where burls are desired. The substrate holder is now as illustrated in FIG. 10C. Optionally, the exposed areas 400b of the surface of the main body 400 are cleaned, e.g. with ozone, and/or treated, e.g. by application of a primer layer to promote adhesion of the burls which are to be formed subsequently.

Burls 406 are now formed in the opening through the thin film stack by a laser sintering process. Other structures on the substrate holder, for example a vacuum ring, can be formed concurrently with the burls. It is also possible to form one or more projections between the burls that are shorter than the burls but have a larger area. Such a projection improves thermal transfer between the substrate and the substrate holder. Such a projection can be, for example 10 μm or more shorter than the burls 406. There are two types of laser sintering methods, both are usable.

In the first method, a thin layer of powder is applied to the area where burls are to be formed. Then one or more laser beams are used to selectively sinter the powder in the area where the burls are to be formed. When that is complete, another thin layer of powder is applied and selectively heated and sintered. This is repeated so that the burl is built up layer by layer. In an embodiment, each layer has a thickness in the range of from 1 to 1.5 μm. Since the sintering pattern can be varied at each layer, the burl can be built up with any desired shape and/or profile. In this method, the powder may be applied over a large area and multiple burls formed simultaneously or concurrently. Alternatively, powder may be applied to a small area and each burl formed independently. Further details of this process can be found in "Laser micro sintering—a quality leap through improvement of powder packing" by A Streek et al published at laz.htwm.de/43_rapidmicro/55_Ver%C3% B6ffentlichungen/Laser%20micro%20sintering%20%20a% 20quality%20leap%20through%20improvement%20of% 20powder%20packing.pdf.

In the second method, powder is jetted in an inert gas over the area where a burl is to be formed while one or more laser beams irradiate the precise locations where burls are to be formed. Powder selectively adheres to the positions irradiated by the laser beam. By suitably shifting the point of irradiation, a burl of desired profile can be built up. Further details of this process can be found in "MICRO-CLADDING USING A PULSED FIBRE LASER AND SCANNER" by S. Kloetar et al published at laz.htwm.de/43_rapidmicro/55_Ver%C3B6ffentlichungen/Microcladding_ LPM2010.pdf.

As with other sintering techniques, laser sintering works by partially melting particles of the powder so that they adhere together when they cool. Laser sintering has an advantage in that the controlled application of the laser beam allows for spatial control of where sintering takes place. In both methods described above, the powder can be pre-heated to a temperature close to the relevant melting point so that less energy need be applied by the laser beam to complete the sintering. A wide variety of materials can be used in sintering techniques. The powder can be formed of a single material, e.g. a metal such as titanium, a semiconductor such as silicon or a ceramic such as fused silica, cordierite and/or aluminum nitride. In an embodiment, the powder is made of two or more components. One component has a relatively low melting point which melts to form a matrix in which the other particulate component(s) is(are) embedded. The matrix-forming component of the powder can be provided as separate particles or as a coating on particles of another material(s). The matrix forming compound can be any of the single materials mentioned above. The particulate component can be one or more components selected from the group comprising cubic boron nitride, silicon nitride, silicon carbide, titanium nitride, titanium carbide and/or diamond, e.g. diamond-like carbon (DLC). The sintering process can be carried out in an inert atmosphere or a vacuum to help prevent chemical change to the material being sintered or in a controlled atmosphere to promote a chemical change.

Thus, the material from which the burl is to be formed can be selected from a wide range of materials to provide a desired property such as strength of adherence to the material of the base body of the substrate holder. Desirably, the burl is made of the same material as, or a material compatible with, the material of the main body of the substrate holder. For example, it is generally desirable that the burl bond well to the base material of the main body of the substrate so as to provide longevity and robustness in use. In some applications, it is desirable that the burls have high thermal conductivity to assist in temperature conditioning of the substrate. In other applications, a low thermal conductivity can be desirable in order to isolate the substrate. Other relevant properties of the burls that can be affected through choice of material include electrical conductivity, dielectric strength and wear resistance.

Figure 10D:
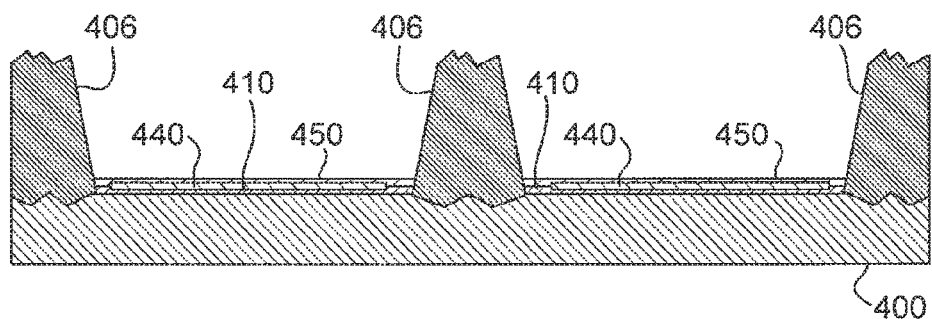
Figure 10E:
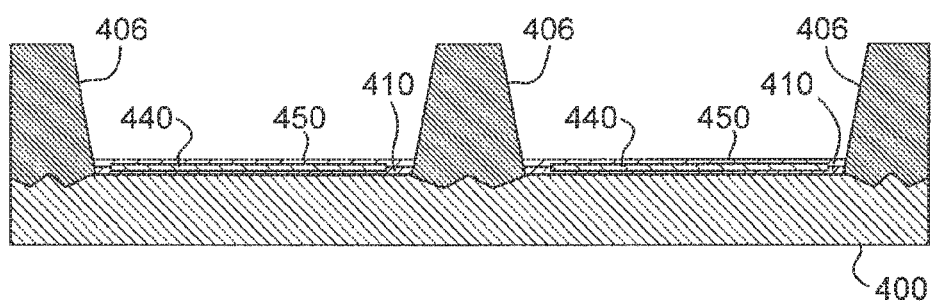

The laser sintering technique for forming the burls generally results in a rough upper surface to the burls as depicted in FIG. 10D. If so, it is desirable to perform a final polishing step so as to provide a smooth upper surface to the burls as illustrated FIG. 10E. In some cases, e.g. if the final polishing is performed with a coarse-grained slurry, it might be desirable to first protect the thin film stacks with an additional coating. However this is often not necessary, for example where the thin film stack contains only electrodes for clamping purposes.

Figure 11:
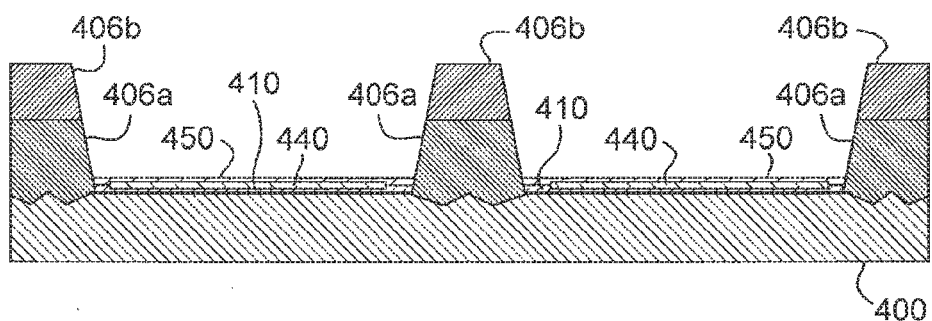
FIG. 11 depicts a substrate holder according to an embodiment of the invention.

A further advantage of the laser sintering process is that it allows the composition of a burl to be varied through its height. It is therefore possible to manufacture burls having one or more sections or layers of different composition and/or property as illustrated in FIG. 11. For example, a lower part 406a of a burl can be formed of material that bonds well to the material of the base body of the substrate holder, while the upper part 406b of the burl is formed of a material having, e.g., an improved wear property. (Note that the base body may be made using a different technique from the burls.) For example, particles of diamond, such as diamond-like carbon (DLC), can be included in the upper part 406b of the burl to improve wear resistance. Alternatively, diamond particles (e.g. DLC) can be included in the lower part 406a to improve thermal conductivity. In an embodiment, a burl is formed with more than two distinct layers. In an embodiment, a burl is formed with a gradual change in composition, content or material property through at least a part of its height.

It is also possible to vary the composition of the powder to be sintered in a direction substantially parallel to the surface on which the burl is being formed. In the powder layer method of sintering, this can be achieved through variation of the composition of the powder within each layer of powder as it is applied. In the powder jetting method, this can be achieved through variation of the composition of the jetted powder with time in synchronization with movement of the point of laser irradiation. Varying the material composition of the burl in a direction substantially parallel to the surface on which it is formed, optionally in addition to variation in the height direction, can allow fine control over one or more mechanical and other properties of the burl, e.g. stiffness.

An advantage of an embodiment of the invention is that burls can be formed with almost any shape in three dimensions. In an embodiment, a burl has a constant cross-section throughout its height. In an embodiment, a burl tapers away from the main body of the substrate holder. In an embodiment, the cross-section of a burl varies with height. In an embodiment, a burl has a cross-section, substantially parallel to the surface of the main body of the substrate holder, that is selected from the group consisting of circle, square, rectangle, oval, rhombus and "racetrack" or "stadium" shape. A "racetrack" or "stadium" shape has two straight parallel sides joined by curves, e.g. semicircles.

In an embodiment, a thin-film stack is provided on only one side of the substrate holder. In an embodiment, no thin film stacks are provided on the substrate holder. In an embodiment, thin-film stacks are provided on both sides of the substrate holder. In an embodiment, burls are provided on both sides of the substrate holder. If burls are provided on both sides of the substrate holder it is not necessary that the same method of forming the burls is used on both sides.

An embodiment of the present invention can be employed to form burls on other components in a lithographic apparatus where controlled contact between a component of the apparatus and an object to be handled is desired.

Figure 12:
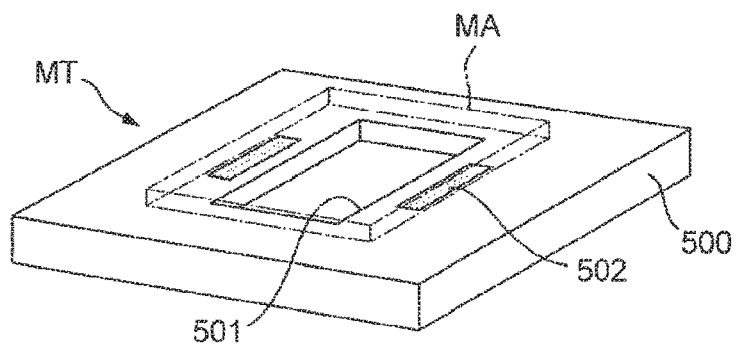
FIG. 12 depicts a support structure for a patterning device according to an embodiment of the invention.

FIG. 12 shows an embodiment of the invention which is a support structure for a patterning device, for example a mask table MT to support a mask MA. The main body 500 of the mask table is, in contrast with a substrate table, provided with a through hole 501 for passage for the projection beam B. The mask MA is supported by burl areas 502 formed by laser sintering on the mask table 500. The use of burls to support the mask MA has similar functions of the use of burls to support a substrate on the substrate table or holder. For example, burls can prevent or reduce the chance of the mask being misaligned or distorted by the presence of a particle between the mask and a surface on which it is supported. Burls can allow a mask to be clamped to a mask table or other support structure using a vacuum and/or electrostatic clamping technique. Since in most lithographic apparatuses the projection system PS reduces the projected image by a factor of 4 or 5, in a scanning mode of operation, the mask is moved with a velocity and acceleration 4 or 5 times greater than the substrate table. Therefore, a commensurately larger clamping force should be exerted. Desirably, a mask is held on the support structure in such a manner that no or minimal stress is generated in the mask. The use of burls can contribute to this aim.

In FIG. 12, burls are shown as provided in discrete areas either side of the aperture 501. In an embodiment, burls can be provided in a continuous area completely surrounding the aperture or in multiple locations spaced around the aperture. The exact location of the burls can be determined in construction of an embodiment. Burls used to support a mask, e.g. on a mask table or mask handling device, can have a diameter of from 100 μm to 1 μm, desirably 300 to 500 μm. The burls can have an elongate shape in plan such as an ellipse or rectangle.

In an embodiment, burls are formed by laser sintering on a clamp for a mask or reticle. The clamp can be a layered structure of, for example, a ULE-ZERODUR-ULE or a thin film stack-ZERODUR-thin film stack. Such a clamp can have a thickness of about 10 mm. The burls can have a pitch of from 2 to 10 mm.

Figure 13:
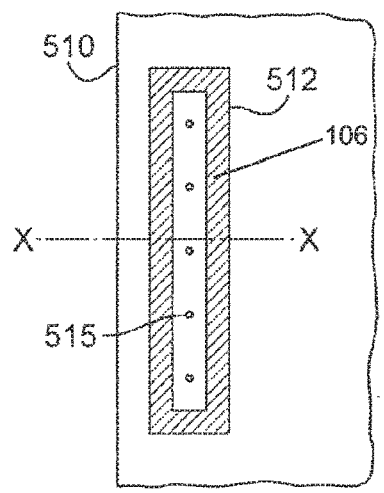
FIG. 13 depicts in plan a part of a support structure according to an embodiment of the invention.
Figure 14:
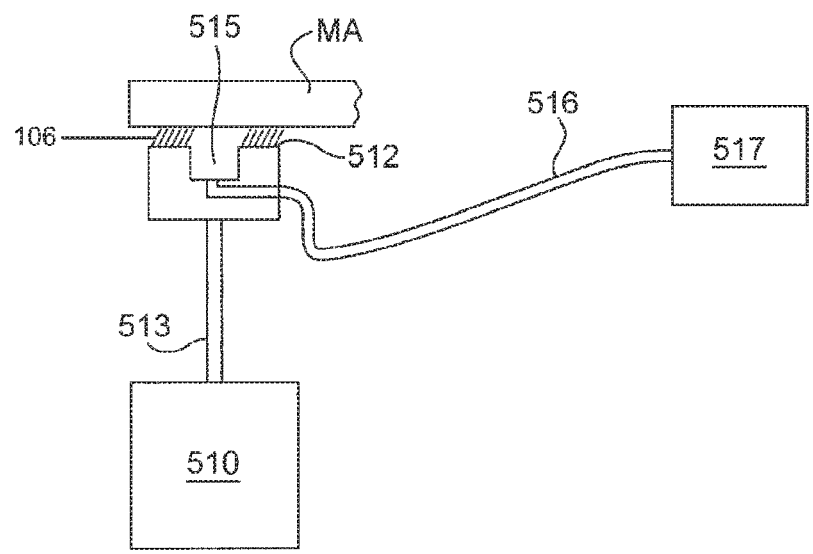
FIG. 14 depicts the support structure of FIG. 13 in cross-section.

FIG. 13 depicts in plan a support structure for a patterning device, e.g. a mask or a reticle, according to an embodiment of the invention. FIG. 14 depicts the same support structure in cross-section along line XX of FIG. 13. The support structure comprises a support member 512 that is supported above a main body 510 by a leaf spring 513. The upper surface of the support member 512 has a central recess 515 surrounded by an area of burls 106. The central recess 515 is connected via conduit 516 to a low pressure (e.g., vacuum) source 517.

When a patterning device such as mask MA is placed on support member 512 and pressure in the central recess 515 is reduced, the patterning device is clamped securely in place. By virtue of the leaf spring 513, the position of the support member 512 in a direction substantially perpendicular to the surface of the patterning device MA is well defined. However, the support member 512 is allowed to move in at least one direction substantially parallel to the surface of the patterning device MA. This means that it help ensure that no or minimal stresses arise in the patterning device MA. Such stresses are undesirable as they might distort the pattern defined by patterning device MA. The provision of burls 106 formed by laser sintering on the support member 512 helps ensure that the patterning device MA is accurately positioned.

Figure 15:
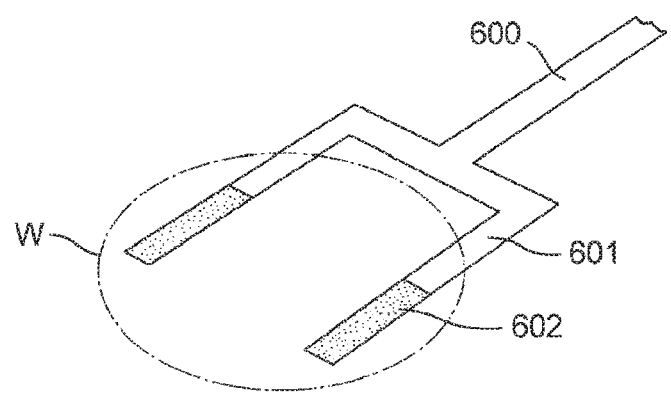
FIG. 15 depicts a substrate handler and gripper according to an embodiment of an invention.

FIG. 15 illustrates a substrate handling arm or gripper 600 according to an embodiment of the invention. Substrate handling arm 600 is driven by one or more actuators (not shown). Substrate handling arm 600 is used to transfer a substrate between, e.g., a loading dock and a pre-alignment stage, between the pre-alignment stage and the substrate table and/or between the substrate table and an unloading dock. Similar handling devices may be used in the track part of a lithocell or may be used to move a patterning device (e.g., a mask). The substrate handling arm 600 comprises a pair of fingers or prongs 601 spaced apart in a substantially horizontal plane. An upper surface, or part thereof, of each of the prongs 601 is provided with an area 602 having burls formed by laser sintering. The use of burls on the substrate handling arm can have one or more of the same advantages as described above, that is, e.g., enabling the use of a vacuum and/or electrostatic clamping technique and/or preventing particulates distorting the substrate.

Figure 16:
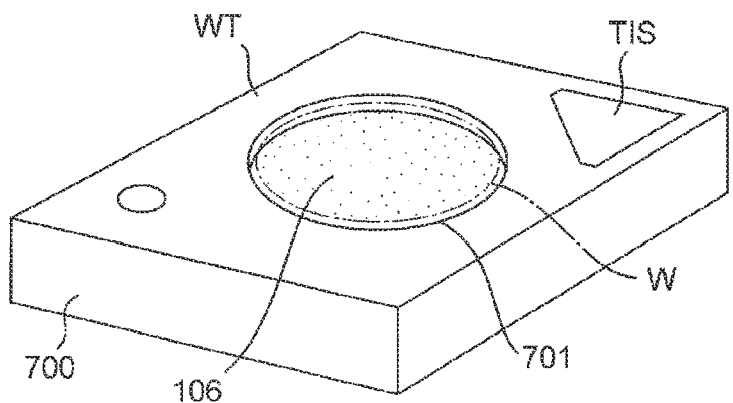
FIG. 16 depicts a substrate table according to an embodiment of the invention.

FIG. 16 shows an embodiment of the invention in which a substrate holder is integrated with the substrate table WT. The holder WT has a main body 700 in which is formed a recess 701 within which the substrate W can be accommodated. The lower surface of the recess 701 is provided with burls 106 formed by laser sintering described above. The depth of the recess 701 and height of burls 106 are determined to help ensure that the upper surface of the substrate W is substantially coplanar with the upper surface of the main body 700. In this way, one or more sensors, such as a transmission image sensor TIS, provided in the substrate table WT can make measurements at a substantially same vertical position as the exposures onto the substrate W will be performed.

An advantage of embodiment of the present invention is that burls can be formed reliably and accurately on a wider variety of surfaces than previously known methods of forming burls. Thus, burls can be provided on a component that would not have been suitable for provision of burls by prior techniques such as a material removal technique, for example electric discharge machining (EDM).

A further advantage is that methods described herein can be used to repair burls, individually or collectively. Two methods of repairing burls according to embodiments of the invention will be described below. These methods can be used to repair burls formed by any method, not just burls formed by laser sintering.

Figure 17A:
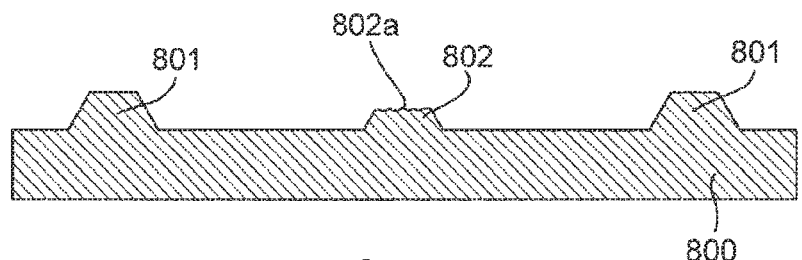
FIGS. 17A to C depict steps in a method of repairing a substrate holder according to an embodiment of the invention.
Figure 17B:
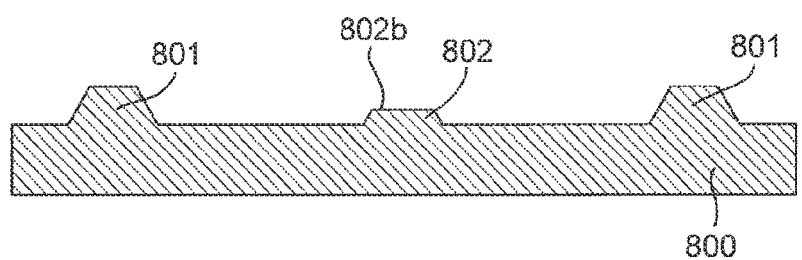
Figure 17C:
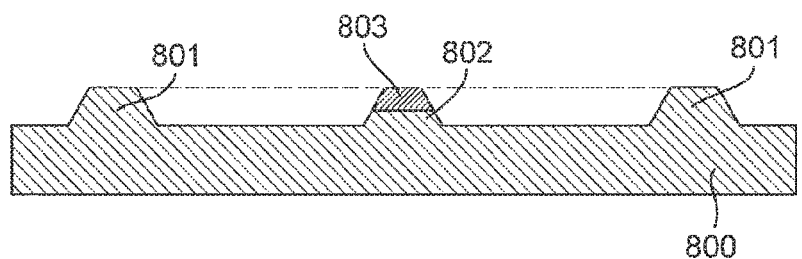

In a repair method according to an embodiment of the invention, steps of which are illustrated in FIGS. 17A to 17C, individual burls are repaired. As shown in FIG. 17A, an object holder 800 has a plurality of burls 801 and a damaged burl 802. The damaged burl 802 has a rough upper surface 802a caused by, for example, wear or physical damage. The damaged burl is further ground down to provide a smooth surface 802b as shown in FIG. 17B. A temporary protective coating can be provided to cover intact burls 801 during this process. If desired, the ground surface 802b can be cleaned, e.g. with ozone, and/or pre-treated, e.g. by application of a primer. A laser sintering technique, as described above, is next used to rebuild the burl to its original shape and/or height (or to a different desired shape and/or height). This may involve building the repaired burl 803 to a height higher than the ultimately designed height and polishing back to a level matching the height of intact burls 801, as shown in FIG. 17C.

Figure 18A:
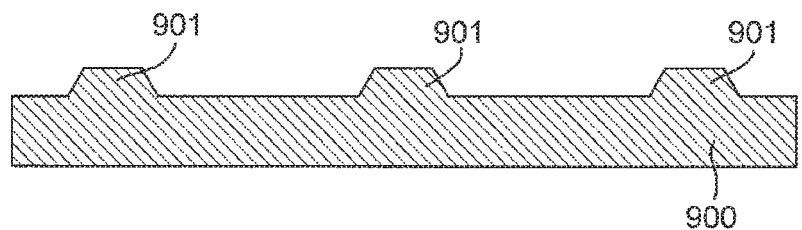
FIG. 18A to C depict steps in a method of repairing a substrate holder according to an embodiment of the invention.
Figure 18B:
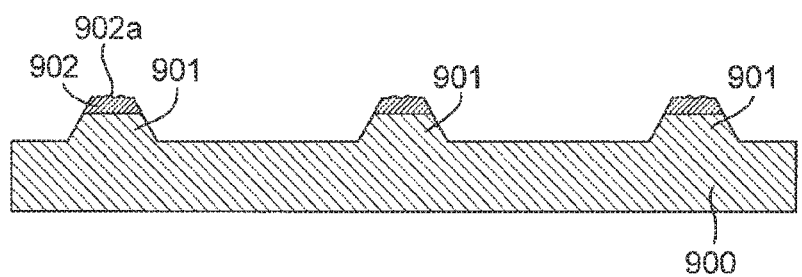
Figure 18C:
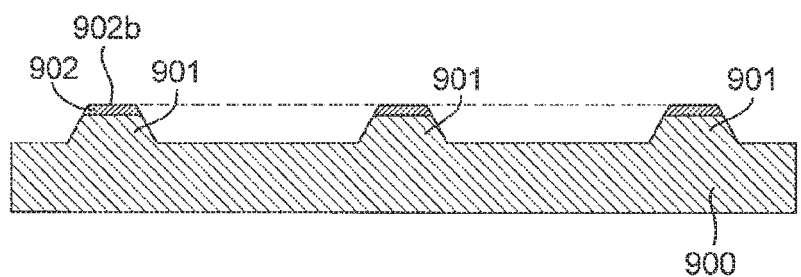

In a further repair method, steps of which are depicted in FIG. 18A to 18C, a plurality of burls 901 on an object holder 900 are repaired simultaneously. This approach is particularly applicable for the periodic rehabilitation of an object holder to account for wear rather than to address isolated incidences of damage. This method can also be used to adjust the height of burls to suit changed operating parameters, e.g. a change in thickness of a substrate to be exposed.

In the method of this embodiment, the upper surfaces of burls 901, shown in FIG. 18A, can optionally be cleaned, e.g. using ozone, or prepared, e.g. by application of a primer. Then an additional layer 902 is built up on the burls 901 by a laser sintering process as described above. In an embodiment, the additional layer 902 has a thickness in the range of from 1 to 5 μm, desirably 2 to 3 μm. In most cases this will provide a rough upper surface 902a, shown in FIG. 18B, which is at a higher height than the ultimate desired height for the burls. The burls can then be polished back to provide a desired flatness and desired roughness of top surface 902b at the desired height, as shown in FIG. 18C.

As well as a direct benefit of providing a method of repairing burls, namely that damaged components do not always need to be replaced, the existence of a repair technique enables burls to be formed directly on a component where it would be economically undesirable to replace the component in the invent of damage to one or more burls.

An embodiment of the present invention advantageously enables the use of burls on a component of a lithographic apparatus such as a substrate table, a support structure for a patterning device, a mask table, a wafer handler, a mask handler, a gripper, a pre-alignment stage, a process device in a track, a substrate handling robot, a conditioning plate, a substrate conditioning unit and/or a sensor mount. Burls manufactured according to an embodiment of the invention can be used wherever an object—such as a substrate, patterning device, optical element or sensor—is to be held or mounted at a precise location. A sensor which can be mounted on burls formed according to an embodiment of the invention may include a transmission image sensor and/or an interferometric aberration sensor.

An advantage of embodiment of the present invention is that it can form burls more accurately than a subtractive technique such as electric discharge machining. With an embodiment of the invention, burls may be formed reliably and accurately. Any burls that are missing or damaged in the manufacturing process can be easily added or repaired. In an embodiment the body may be made by a different technique from the burls formed thereon.

As will be appreciated, any of the above described features can be used with any other feature and it is not only those combinations explicitly described which are covered in this application.

Although specific reference may be made in this text to the use of lithographic apparatus in the manufacture of ICs, it should be understood that the lithographic apparatus described herein may have other applications in manufacturing components with microscale, or even nanoscale features, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention, at least in the form of a method of operation of an apparatus as herein described, may be practiced otherwise than as described. For example, the embodiments of the invention, at least in the form of a method of operation of an apparatus, may take the form of one or more computer programs containing one or more sequences of machine-readable instructions describing a method of operating an apparatus as discussed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing and sending signals. One or more multiple processors are configured to communicate with at least one of the controllers. For example, each controller may include one or more processors for executing the computer programs that include machine-readable instructions for the methods of operating an apparatus as described above. The controllers may include data storage media for storing such computer programs, and/or hardware to receive such media. So the controller(s) may operate according to the machine readable instructions of one or more computer programs.

An embodiment of the invention may be applied to substrates with a width (e.g., diameter) of 300 mm or 450 mm or any other size.

One or more embodiments of the invention may be applied to any immersion lithography apparatus, in particular, but not exclusively, those types mentioned above, whether the immersion liquid is provided in the form of a bath, only on a localized surface area of the substrate, or is unconfined on the substrate and/or substrate table. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

In a first aspect of the invention there is provided a method of manufacturing an object holder for use in a lithographic apparatus, the method comprising: providing a main body having a surface; and forming a plurality of burls on the surface, the burls projecting from the surface and having end surfaces to support an object, wherein forming at least part of at least one of the burls comprises laser-sintering.

The laser-sintering may comprise: applying a layer of powder to the surface; and selectively irradiating the layer of powder with a radiation beam so as to cause at least partial melting of the powder at irradiated locations. In an embodiment, the laser-sintering comprises: irradiating a location on the surface; and jetting powder at the irradiated location.

The main body may be formed of a different material than the at least one burl. The at least one burl may comprise at least one material selected from the group consisting of: Ti, Si, fused silica, Cordierite, diamond-like carbon, SiC, $SiO_2$, AlN, TiN and CrN. The at least one burl may be formed of a matrix material and particles embedded in the matrix material. The matrix material may comprise at least one material selected from the group consisting of: Ti, Si, fused silica, Cordierite, diamond-like carbon, SiC, $SiO_2$, AlN, TiN and CrN. The particles may comprise at least one material selected from the group consisting of: cubic boron nitride, silicon nitride, silicon carbide, titanium nitride, titanium carbide and diamond.

At least one burl may comprise a first layer of a first material and a second layer of a second material that is different from the first material. The first and second materials may be different in a property or a component.

In an embodiment, the object is a substrate or a patterning device. A thin film stack may be provided on the surface, the plurality of burls projecting further from the surface than the thin film stack.

In a second aspect of the invention there is provided a method of repairing an object holder having burls for use in a lithographic apparatus, the method comprising: preparing a burl to be repaired; applying a layer of material to the burl to be repaired by laser-sintering; and polishing the layer of material.

In a third aspect of the invention there is provided an object holder for use in a lithographic apparatus, the object holder comprising: a main body having a surface; and a plurality of burls provided on the surface and having end surfaces to support an object, wherein at least part of at least one of the burls has been formed by laser-sintering.

In an embodiment, the main body is formed of a different material than the part of the burl. The at least one burl may comprise at least one material selected from the group consisting of: Ti, Si, fused silica, cordierite, diamond-like carbon, SiC, $SiO_2$, AlN, TiN and CrN. The at least one burl may be formed of a matrix material and particles embedded in the matrix material. The matrix material may comprise at least one material selected from the group consisting of: Ti, Si, fused silica, cordierite, diamond-like carbon, SiC, $SiO_2$, ALN, TiN and CrN. The particles may comprise at least one material selected from the group consisting of cubic boron nitride, silicon nitride, silicon carbide, titanium nitride, titanium carbide and diamond.

At least one burl may comprise a first layer of a first material and a second layer of a second material that is different from the first material. The first and second materials may be different in a property or a component. The at least one burl may have a substantially constant cross-section substantially parallel to the surface. The at least one burl may taper away from the surface. A cross-section, substantially parallel to the surface, of the at least one burl may be selected from the group consisting of: circle, square, rectangle, oval, rhombus and "racetrack" or "stadium" shape. The main body may comprise at least one material selected from the group consisting of: ZERODUR, cordierite, SiC, SiSiC, AlN, Invar, ceramic and glass-ceramic.

The object holder is constructed and arranged to support, as the object, at least one selected from: a substrate, a patterning device, a sensor, and optical element. In an embodiment the object is a substrate and the object holder is a substrate holder. The substrate holder may have a diameter substantially equal to 200 mm, 300 mm or 450 mm. The object may be a patterning device and the object holder is a support structure for the patterning device. The object holder may be a reticle clamp. The object holder may be a substrate gripper. A thin film stack may be provided on the surface, the plurality of burls projecting further from the surface than the thin film stack.

In a fourth aspect of the invention there is provided a lithographic apparatus, comprising: a support structure configured to support a patterning device; a projection system arranged to project a beam patterned by the patterning device onto a substrate; and a substrate holder arranged to hold the substrate, the substrate holder being according to features of the third aspect of the invention.

The lithographic apparatus may comprise a substrate table and wherein the substrate holder is integrated into the substrate table.

In a fifth aspect of the invention there is provided a table for use in a lithographic apparatus, the table comprising: a main body having a surface; and a plurality of burls on the surface and having end surfaces to support an object, for example a substrate, wherein the burls have been formed by laser-sintering.

In a sixth aspect of the invention there is provided a lithographic apparatus, comprising: a support structure configured to support a patterning device; a projection system arranged to project a beam patterned by the patterning device onto a substrate; and a table according to the fifth aspect of the invention.

In a seventh aspect of the invention, there is provided a device manufacturing method using a lithographic apparatus, the method comprising: projecting a beam patterned by a patterning device onto a substrate while holding the substrate on a substrate holder, wherein the substrate holder comprises: a main body having a surface; and a plurality of burls on the surface and having end surfaces to support the substrate, wherein the burls have been formed by laser-sintering.

The descriptions above are intended to be illustrative, not limiting. Thus, it will be apparent to one skilled in the art that modifications may be made to the invention as described without departing from the scope of the claims set out below.

The invention claimed is:

1. A method of repairing an object holder for use in a lithographic apparatus, the object holder having a plurality of burls to support an object and having a damaged burl having a rough upper surface, the method comprising:
    grinding the rough upper surface of the damaged burl so as to provide a smooth surface; and
    rebuilding the damaged burl to at least its original shape and/or height by adding a layer on top of the smooth surface such that its height is higher than the height of the plurality of burls.

2. The method of claim 1, wherein the adding the layer on top of the smooth surface comprises laser-sintering.

3. The method of claim 2, wherein the laser-sintering comprises:
    applying a layer of powder on top of the smooth surface; and
    selectively irradiating the layer of powder with a radiation beam so as to cause at least partial melting of the powder at irradiated locations.

4. The method of claim 2, wherein the laser-sintering comprises:
    irradiating a location on the smooth surface; and
    jetting powder at the irradiated location.

5. The method of claim 1, wherein the rebuilding the damaged burl comprises laser-sintering.

6. The method of claim 1, wherein the rebuilding the damaged burl comprises polishing the damaged burl to level match the height of the plurality of burls.

7. The method of claim 1, further comprising providing a temporary protective coating to cover the plurality of burls during the grinding of the rough upper surface of the damaged burl.

8. The method of claim 1, further comprising cleaning and/or pre-treating the smooth surface.

9. The method of claim 8, wherein the smooth surface is cleaned with ozone.

10. The method of claim 8, wherein the smooth surface is pre-treated by application of a primer.

11. The method of claim 1, wherein the rebuilt burl comprises at least one material selected from the group consisting of: Ti, Si, fused silica, cordierite, diamond-like carbon, SiC, $SiO_2$, AlN, TiN and CrN.

12. The method of claim 1, wherein the rebuilt burl comprises a matrix material and particles embedded in the matrix material.

13. The method of claim 1, wherein the rebuilt burl comprises a first layer of a first material and a second layer of a second material that is different from the first material.

14. The method of claim 13, wherein the first and second materials are different in a property or a component.

15. The method of claim 1, wherein the object is a substrate or a patterning device.

16. A method of repairing an object holder for use in a lithographic apparatus, the object holder having a plurality of burls to support an object and having a damaged burl having a rough upper surface, the method comprising:
    grinding the rough upper surface of the damaged burl so as to provide a smooth surface; and
    rebuilding the damaged burl to at least its original shape and/or height by adding a layer on top of the smooth surface by laser-sintering.

17. The method of claim 16, wherein the laser-sintering comprises:
    applying a layer of powder on top of the smooth surface; and
    selectively irradiating the layer of powder with a radiation beam so as to cause at least partial melting of the powder at irradiated locations.

18. The method of claim 16, wherein the laser-sintering comprises:
    irradiating a location on the smooth surface; and
    jetting powder at the irradiated location.

19. The method of claim 16, wherein the rebuilt burl comprises a first layer of a first material and a second layer of a second material that is different from the first material.

20. The method of claim 16, wherein the rebuilt burl comprises a matrix material and particles embedded in the matrix material.

\* \* \* \* \*